United States Patent
Fortin

(10) Patent No.: US 6,372,671 B1
(45) Date of Patent: Apr. 16, 2002

(54) SURFACE STABILIZATION OF SILICON RICH SILICA GLASS USING INCREASED POST DEPOSITION DELAY

(75) Inventor: Vincent Fortin, Santa Clara, CA (US)

(73) Assignee: Zarlink Semiconductor Inc., Ottawa (CA)

( * ) Notice: Subject to any disclaimer, the term of this patent is extended or adjusted under 35 U.S.C. 154(b) by 0 days.

(21) Appl. No.: 09/652,796

(22) Filed: Aug. 31, 2000

(30) Foreign Application Priority Data

Sep. 1, 1999 (GB) .............................................. 9920526

(51) Int. Cl.[7] ............................................. H01L 21/469

(52) U.S. Cl. ........................ 438/787; 427/578; 427/579; 427/535; 438/788

(58) Field of Search ................................ 427/578, 579, 427/535; 438/787, 788

(56) References Cited

U.S. PATENT DOCUMENTS

| 4,708,884 A | * | 11/1987 | Chandross et al. | ......... 427/573 |
| 5,593,741 A | * | 1/1997 | Ikeda | ......................... 427/579 |
| 5,633,208 A | | 5/1997 | Ishikawa | |
| 5,656,337 A | * | 8/1997 | Park et al. | ................... 427/539 |
| 6,232,216 B1 | * | 5/2001 | Machida et al. | ............ 427/569 |

* cited by examiner

*Primary Examiner*—Bret Chen
(74) *Attorney, Agent, or Firm*—Marks & Clerk

(57) ABSTRACT

A dielectric layer of silica glass is formed by plasma enhanced chemical vapor deposition (PECVD) wherein a gaseous precursor of the dielectric layer is supplied to a deposition chamber in the presence of an electromagnetic field. The supply of the gaseous precursor is discontinued while continuing to maintain the electromagnetic field for a delay time exceeding 0.5 seconds after the discontinuation of the supply of the gaseous precursor. This improves the hydrophilic properties of said film. A siloxane-based SOG film is deposited on the dielectric layer.

8 Claims, 1 Drawing Sheet

SURFACE STABILIZATION OF SILICON RICH SILICA GLASS USING INCREASED POST DEPOSITION DELAY

This invention relates to the field of semiconductors, and in particular to a method of improving the adhesion of Spin-on-Glass (SOG) films on an underlying dielectric layer.

SOG films are used in very large scale integration (VLSI) circuits for enhanced planarization of the devices. Planarization, as the name implies, involves smoothing out the contours of the underlying layer. Typically, the SOG layer is deposited on an inter-metal dielectric (IMD1) layer, which is commonly a PECVD (plasma enhanced chemical vapor deposition) silicon oxide film. A second IMD (IMD2) PECVD oxide layer is deposited on the SOG film to cap it and prevent any contact with the upper metallic structures.

In order to obtain a good adhesion between the IMD underlying film and a siloxane-based SOG film, the IMD layer must show strong hydrophilic properties due to the presence of the silanol groups in the SOG layer. Such properties are known to increase and enhance the bonds between the coated SOG film and the PECVD IMD1 silicon oxide layer. The hydrophilic characteristics can be measured using a goniometer. A goniometer uses the Kaelble technique to obtain the surface tension between a liquid and a solid surface. In this technique, the angle a drop of water makes with the surface is measured. The greater the angle, the less hydrophilic the surface.

When test samples consisting of a SOG film deposited on an IMD1 film were subjected to temperature cycling tests, severe delamination problems were observed between the SOG layer and the IMD1 film. Such a test consists of many cycles between ranging between −65° C. and +150° C. The delamination observed at the SOG/IMD1 interface causes electrical failure of the integrated circuits.

In order to avoid the delamination at the SOG/IMD1 interface, the adhesion between these films must be enhanced. Any treatment to enhance adhesion should be as simple as possible to avoid forming any cracks in the SOG, which is very delicate. In addition, it should have minimal effect on throughput since additional processing steps increase the cost and complexity of manufacture.

One prior art treatment for improving adhesion, which is described in U.S. Pat. No. 5,556,806, involves treating the IMD1 layer with an oxygen plasma prior to depositing the SOG. Such a plasma treatment is intended to improve the IMD1 surface roughness, which it is believed might be helpful in order to enhance the SOG adhesion on IMD1. This process, however, involves an extra processing step, which significantly increases the fabrication time, and thus the cost of manufacture of the devices.

According to the present invention there is provided a method of fabricating a semiconductor device, comprising the steps of forming a dielectric layer of silica glass by plasma enhanced chemical vapour deposition (PECVD) wherein a gaseous precursor of said dielectric layer is supplied to a deposition chamber in the presence of an electromagnetic field; discontinuing the supply of said gaseous precursor while continuing to maintain the electromagnetic field for a delay time exceeding 0.5 seconds after the discontinuation of the supply of said gaseous precursor to improve the hydrophilic properties of said film; and depositing a siloxane-based SOG film on said dielectric layer.

This technique has been found to significantly improve the hydrophilic properties of silicon rich silica glass and thus the adhesion to the siloxane-based SOG film. The preferred post time is one second. It can be longer, but should not exceed about 3 seconds since otherwise the dielectric surface will become too rough. It is not believed that it has previously been realized that the post A delay time can affect the hydrophilic properties of the deposited layer.

The dielectric is preferably silicon rich silica glass (SRSG), which is known per se for intermetal dielectic layers (IMD).

As in conventional PECVD, the plasma, normally created by the application of an RF field, activates the reaction between the precursors. The precursors are $SiH_4$, $N_2O$ and $N_2$. The $N_2$ gas is used as a carrier gas in the deposition chamber while the silicon oxide is formed from a reaction between $SiH_4$ and $N_2O$. $SiH_4$ serves as the source of silicon and $N_2O$ the source of oxygen.

An important feature of this invention is the fact that the increase in the delay time does not affect the process throughput since no additional ex situ treatments are required. In conventional equipment, the standard delay between the time $SiH_4$ flow is turned off in the reactor and the RF is turned off (referred to in the art as the post-A delay) is pre-set at 0.5 s. The wafers are then moved to another station for further processing.

The invention will now be described in more detail, by way of example only, with reference to the accompanying drawings, in which.

In order to demonstrate the invention, silicon wafers were located in a 7-station deposition chamber in the Novellus Concept One PECVD system. This consists of seven working stations plus one transfer station. A shower-head is located over each station. The precursors flow from these shower-heads. These shower heads are also used as electrodes to control the RF frequency to create the plasma, which is applied to the deposition chamber to initiate the reactions between the precursors.

$SiH_4$, $N_2O$ and $N_2$ were supplied to the deposition chamber in a manner known per se to create a silicon rich silica glass (SRSG) layer on the silicon wafer. The SRSG process is described, for example, by S. Blain et al. [S. Blain, L. Ouellet, Y. Tremblay, "A Stress-Temperature Hysteresis and Gas Desorption Study of Various Oxide Films Used in Intermetal Dielectric Applications", Feb. 21–22, 1995 DUMIC Conference].

The $N_2$ gas is used as a carrier gas in the deposition chamber while the silicon oxide is formed from a reaction between $SiH_4$ and $N_2O$. $SiH_4$ serves as the source of silicon and $N_2O$ the source of oxygen.

In order to determine the hydrophilic properties, and long term stability, of the dielectric layer, 3500 Å RSG (silicon rich silica glass) film was deposited on the silicon wafer using different delay times (known as post A delays). The contact angle of a water drop was then measured for each sample using the Kaelble technique.

Figure 1:
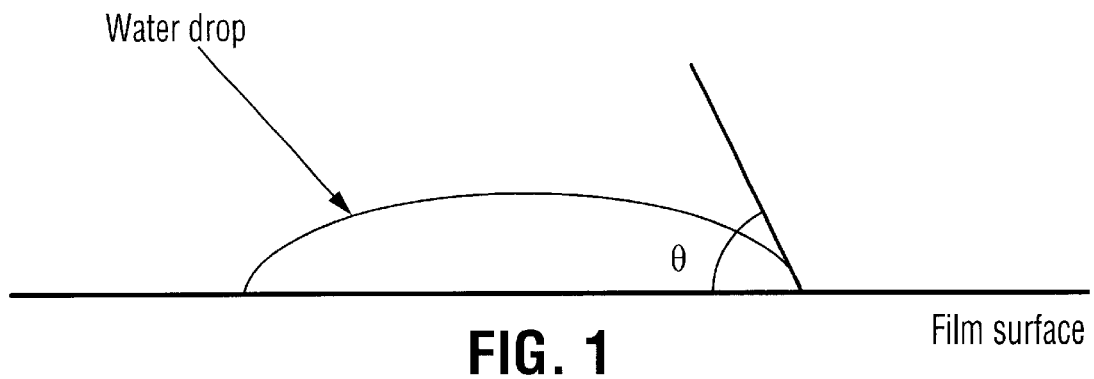
FIG. 1 shows a water drop on a plane surface.
Figure 2:
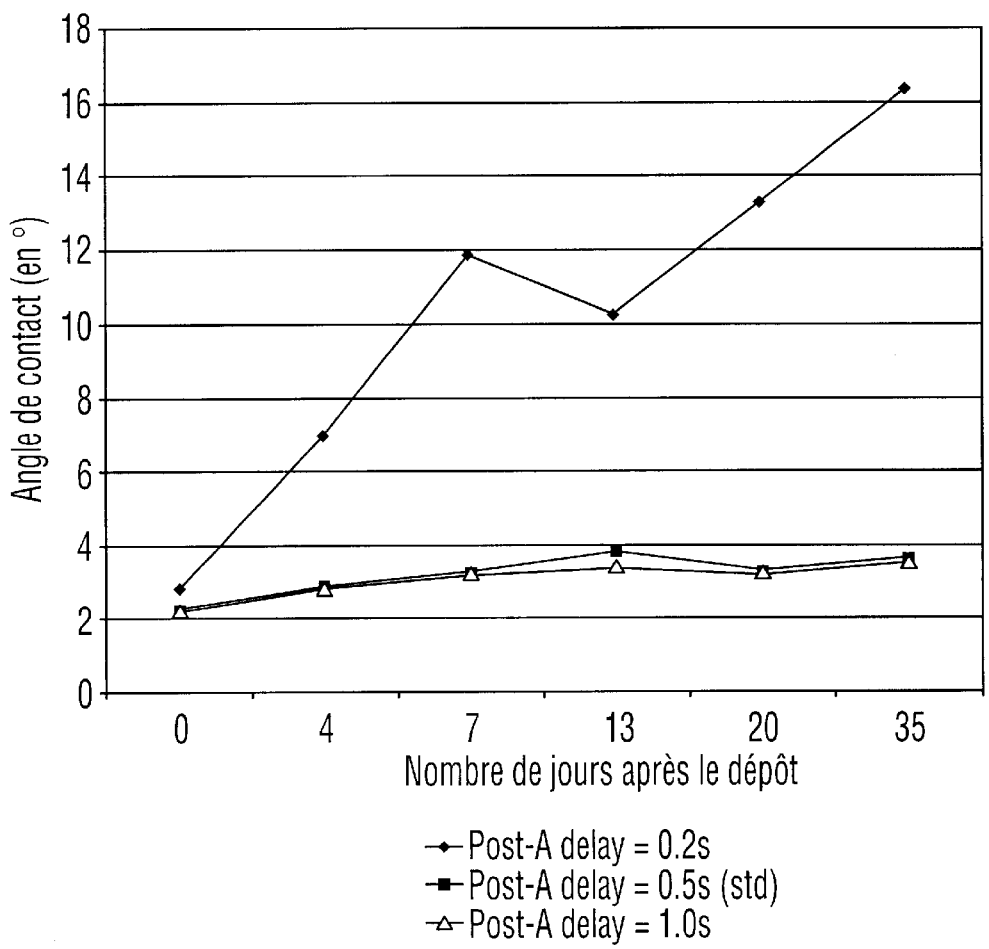
FIG. 2 is a graph showing the contact angle of a water drop on the dielectric surface against time in days for different delay times.

FIG. 1 illustrates this technique. A water drop 1 is placed on the deposited SRSG layer and the contact angle θ measured. The more hydrophilic the film, the lower will be the contact angle θ. Conversely, the more hydrophobic the film, the higher the contact angle θ.

It was observed that a modification of the post A delay affects the hydrophilic properties of the films.

The following table presents the angles obtained immediately after film deposition.

TABLE 1

Angle obtained immediately after film deposition as a function of post-A delay.

| PECVD Silicon oxide (SRSG) film - 3500Å | Contact angle (θ) |
|---|---|
| Post-A delay = 0.2 s | 4.5° |
| Post-A delay = 0.5 s (standard) | 1.9° |
| Post-A delay = 1.0 s | 1.7° |

It will be seen that with a post A delay of less than 0.5 seconds, the contact angle is much higher and the hydrophilic properties much worse. However, for good SOG adhesion, it is important that the hydrophilic properties remain stable after deposition.

A second experiment was performed in which the contact angle was measured after 13 days. The results are shown in the following table.

| PECVD Silicon oxide (SRSG) film - 3500Å | Contact angle (θ) |
|---|---|
| Post-A delay = 0.2 s | 21.7° |
| Post-A delay = 0.5 s (standard) | 20.8° |
| Post-A delay = 1.0 s | 2.5° |

Here the results are even more dramatic. After 13 days, the wafers with a post A delay of one second are still highly hydrophilic (contact angle 2.5°), whereas the wafers with a post A delay of 0.2 and 0.5 seconds have very poor hydrophilic properties.

A third run of wafers was fabricated in a manner similar to the second run. The contact angle is shown up to 35 days. In the third run, the wafers with post A delays of 0.2 and 0.5 seconds gave similar results, whereas the wafers with a post A delay of one second showed remarkable improvement.

It is believed that low post-A delays, in the order of 0.2 seconds, always give poor results. Delays in the order of one second give good results with long-term stability, and this can be increased up to about three seconds. Beyond three seconds excess surface roughening will occur. It is believed that 0.5 seconds is right on the borderline between the good and poor results. As shown by a comparison of the second and third runs, a post-A delay of 0.5 seconds sometimes gives good results and sometimes does not. In order to realize the advantages of the invention, the post-A delay should be above 0.5 seconds, typically 0.6 seconds and above, and preferably in the order of one second. The post A delay can be increased further, but an additional increase results in excess surface roughening and increases unnecessarily the manufacturing time.

From the results presented above therefore, it was concluded that using a post-A delay over 0.5 s improves the stability of the IMD layer hydrophilic properties as a function of time. Such a characteristic therefore improves the process robustness limiting the risks of delamination due to an improved adhesion between the films during a temperature cycling test.

It seems from the results presented earlier that the IMD1 deposited with a post-A delay of 0.5 s is not stable in time since it shows some variations of the hydrophilic properties. Therefore, the post-A delay of one second offers a better stability from this point of view.

To complete the process a siloxane-based SOG film is deposited on the dielectric film.

It is believed that the reason the invention works is that a longer post-A delay creates more silanol groups in the IMD layer. Such silanol groups in the IMD layer are directly responsible for better adhesion of SOG on the IMD film. This is due to the fact that during SOG coating and curing, polymerization occurs due to condensation of the silanol and ethoxy groups.

The system used for this invention was a 7-station deposition chamber, but it will be understood by one skilled in the art that it would be possible to obtain similar results with a single wafer PECVD chamber, or any other kind of suitable PECVD chamber.

The deposition technique could also be changed since it is believed that the surface is modified due to the reduced amount of precursors available during the post-A delay. Therefore, this invention could be used with other applications and techniques. It could be applied to metallization, polymers, etc. The deposition technique could also be any PVD (Physical Vapor Deposition) techniques.

This invention can also be used for any plasma enhanced chemical vapor deposited (PECVD) films or plasma treatments. In particular, it can be used for any other steps in the manufacturing of integrated circuits requiring hydrophilic (or hydrophobic) underlying films, plasma etching of materials, PECVD metallization, PECVD passivation layers, and PVD metallization.

The invention finds application in emission diodes, liquid crystal displays, electro-chromic displays, flat panel displays, photodetectors, solar batteries, sensors and actuators, optical fibers, corrosion protection, adhesion promoters, friction reduction, and optical/thermal reflectance adjustments.

I claim:

1. A method of fabricating a semiconductor device, comprising the steps of:
   forming a dielectric layer of silica glass by plasma enhanced chemical vapour deposition (PECVD) wherein a gaseous precursor of said dielectric layer is supplied to a deposition chamber in the presence of an electromagnetic field;
   discontinuing the supply of said gaseous precursor while continuing to maintain the electromagnetic field for a delay time exceeding 0.5 seconds after the discontinuation of the supply of said gaseous precursor to improve the hydrophilic properties of said layer; and
   depositing a siloxane-based SOG film on said dielectric layer.

2. A method as claimed in claim 1, wherein said delay time lies in the range of 1 to 3 seconds.

3. A method as claimed in claim 2, wherein said delay time is one second.

4. A method as claimed in claim 1, wherein said gaseous precursor is silane ($SiH_4$).

5. A method as claimed in claim 1, wherein said delay time is at least 0.6 seconds.

6. A method as claimed in claim 1, wherein said silica glass is silicon rich silica glass (SRSG).

7. A method as claimed in claim 1, wherein said electromagnetic field is an RF field.

8. A method of fabricating a semiconductor device, comprising the steps of:
   forming a dielectric layer of silicon rich silica glass (SRSG) by plasma enhanced chemical vapour deposition (PECVD) wherein silane ($SiH_4$) is supplied to a deposition chamber in the presence of an RF field;
   discontinuing the supply of said silane while continuing to maintain the electromagnetic field for a delay time of at least 0.6 seconds after the discontinuation of the supply of said gaseous precursor to improve the hydrophilic properties of said layer; and
   depositing a siloxane-based SOG film on said dielectric layer.

* * * * *